United States Patent
Kathawala et al.

(10) Patent No.: US 10,108,470 B2
(45) Date of Patent: Oct. 23, 2018

(54) PARITY STORAGE MANAGEMENT

(71) Applicant: SanDisk Technologies, Inc., Plano, TX (US)

(72) Inventors: Gulzar A. Kathawala, Milpitas, CA (US); Shuenghee Park, Milpitas, CA (US); Jingfeng Yuan, Milpitas, CA (US); Mark Dancho, Milpitas, CA (US)

(73) Assignee: SanDisk Technologies LLC, Addison, TX (US)

( * ) Notice: Subject to any disclaimer, the term of this patent is extended or adjusted under 35 U.S.C. 154(b) by 195 days.

(21) Appl. No.: 14/981,386

(22) Filed: Dec. 28, 2015

(65) Prior Publication Data

US 2017/0185472 A1    Jun. 29, 2017

(51) Int. Cl.
| | |
|---|---|
| G06F 11/00 | (2006.01) |
| G06F 11/07 | (2006.01) |
| G06F 12/00 | (2006.01) |
| G06F 11/10 | (2006.01) |
| G11C 29/00 | (2006.01) |

(52) U.S. Cl.
CPC ........ G06F 11/0727 (2013.01); G06F 11/076 (2013.01); G06F 11/1048 (2013.01); G06F 12/00 (2013.01); G11C 29/00 (2013.01)

(58) Field of Classification Search
CPC combination set(s) only.
See application file for complete search history.

(56) References Cited

U.S. PATENT DOCUMENTS

| | | | |
|---|---|---|---|
| 7,818,525 B1 | 10/2010 | Frost et al. | |
| 8,281,220 B2 | 10/2012 | Kitahara | |
| 8,908,307 B1* | 12/2014 | Yang | G11B 20/1833 360/39 |
| 8,996,954 B2* | 3/2015 | Kou | G06F 11/076 714/763 |
| 9,063,874 B2 | 6/2015 | Zhong et al. | |
| 9,135,105 B2 | 9/2015 | Yang et al. | |
| 9,323,609 B2* | 4/2016 | Motwani | G06F 11/1048 |
| 2004/0123180 A1* | 6/2004 | Soejima | G06F 11/1084 714/5.1 |
| 2005/0177764 A1* | 8/2005 | Cassell | G06F 11/0709 714/6.12 |
| 2006/0075290 A1* | 4/2006 | Hartline | G06F 11/1076 714/6.21 |
| 2009/0323412 A1 | 12/2009 | Mokhlesi et al. | |
| 2012/0284586 A1* | 11/2012 | Wang | G11C 7/1006 714/763 |
| 2015/0006981 A1* | 1/2015 | Kou | H03M 13/1102 714/703 |
| 2015/0113319 A1* | 4/2015 | Miyamae | G06F 3/0689 714/6.24 |

* cited by examiner

*Primary Examiner* — Amine Riad
(74) *Attorney, Agent, or Firm* — Loza & Loza, LLP; Gabriel Fitch (57) ABSTRACT

Apparatuses, systems, methods, and computer program products are disclosed for parity storage management. A system includes a plurality of storage elements. A system includes a controller that selects a parity storage element from a plurality of storage elements. A parity storage element has an error rate higher than other elements of a plurality of storage elements, and the parity storage element stores parity data for the plurality of storage elements.

20 Claims, 7 Drawing Sheets

PARITY STORAGE MANAGEMENT

TECHNICAL FIELD

The present disclosure, in various embodiments, relates to memory and/or storage devices and more particularly relates to management of parity storage for memory and/or storage devices.

BACKGROUND

Many data storage devices, such as flash memory devices, store data in cells of non-volatile media. A physical property of each cell, such as a stored charge, voltage, material phase, electrical resistance, magnetization, or the like, is alterable to encode data. A cell's physical property may be variable across a range, which may be divided into discrete states, so that different states correspond to different data values. Sensing whether the cell's physical property satisfies one or more read thresholds (e.g., voltage thresholds, resistivity thresholds, or the like) within its range determines the cell's state, thus allowing recovery of a stored data value.

The data-encoding physical property of a cell may vary over time due to cell damage, charge leakage, temperature effects, disturbances from nearby cells, or the like. An error may occur if the cell moves from one state into an adjacent state. As storage density increases, feature size shrinks, making the cells more susceptible to such disturbances. Parity data may be used to recover data when errors occur from such disturbances.

SUMMARY

Methods are presented for parity storage management. In one embodiment, a method includes determining, at a non-volatile storage device, a storage element of a plurality of storage elements having an error rate higher than other storage elements of the plurality of storage elements. A method, in a further embodiment, includes selecting a storage element as a parity storage element. In certain embodiments, a method includes storing parity data for a plurality of storage elements in a parity storage element.

Systems are presented for parity storage management. A system, in one embodiment, includes a plurality of storage elements. In another embodiment, a system includes a controller that selects a parity storage element from a plurality of storage elements. A parity storage element, in certain embodiments, has an error rate higher than other elements of a plurality of storage elements, and the parity storage element stores parity data for the plurality of storage elements.

Computer program products comprising a computer readable storage medium are presented. In certain embodiments, a computer readable storage medium stores computer usable program code executable to perform operations for parity storage management. In one embodiment, an operation includes selecting a memory element of a plurality of memory elements as a backup memory element. A memory element, in various embodiments, has a higher error rate than other memory elements of a plurality of memory elements. In some embodiments, an operation includes writing backup data to a backup memory element for a plurality of memory elements. An operation, in various embodiments, includes accessing backup data in response to a read error on one of a plurality of memory elements.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

Figure 1:
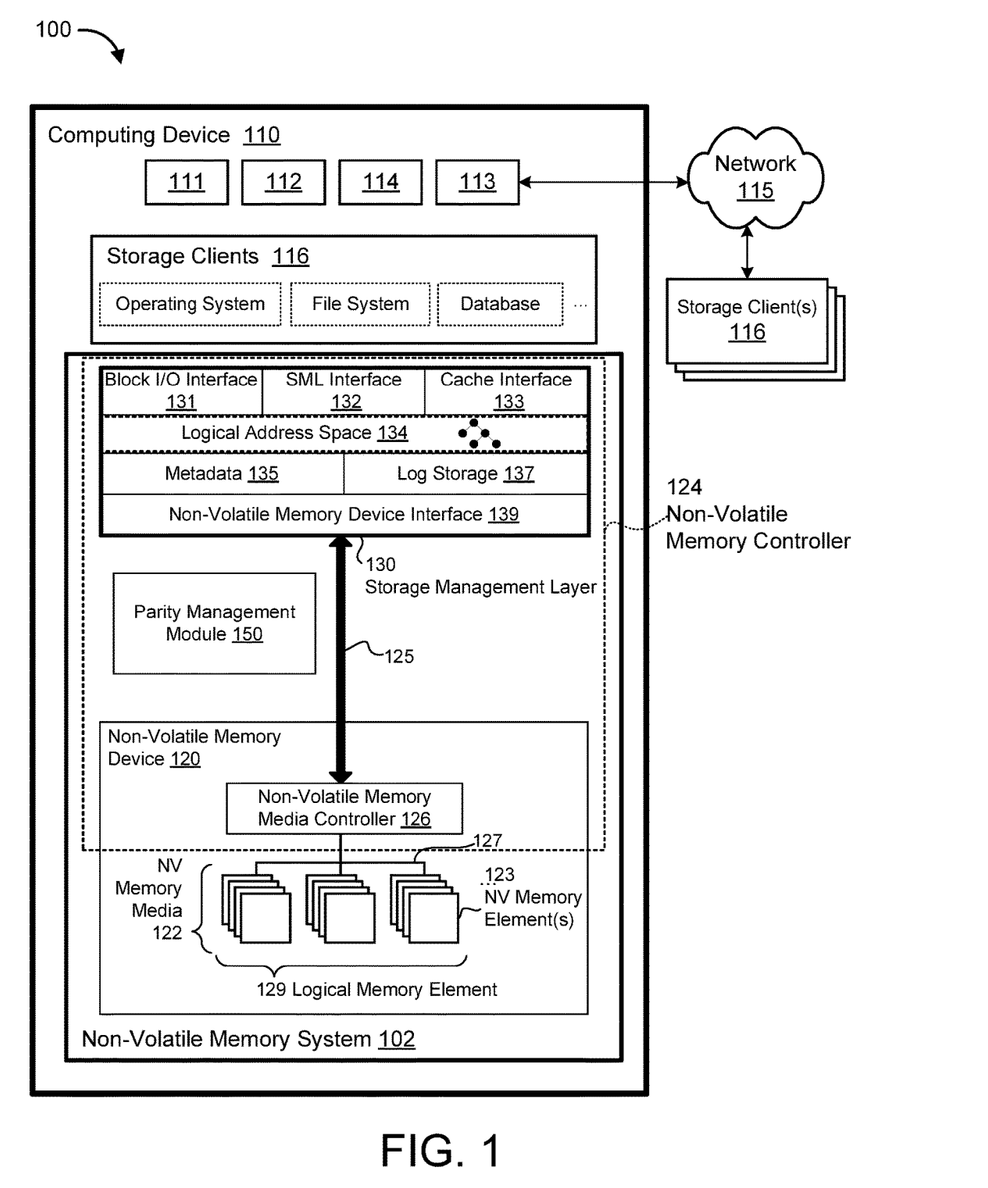
FIG. 1 is a schematic block diagram of one embodiment of a system for parity storage management.

FIG. 1 is a block diagram of one embodiment of a system 100 for parity storage management. The system 100, in the depicted embodiment, comprises a parity management module 150. The parity management module 150 may be part of and/or in communication with one or more of a non-volatile memory controller 124, a non-volatile memory media controller 126, a device driver or storage management layer (SML) 130, or the like. The parity management module 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 124 to a communication network 115, such as an Internet Protocol network, a Storage Area Network, or the like.

The computing device 110 may further comprise a non-transitory, computer readable storage media 114. The computer readable storage media 114 may comprise executable instructions configured to cause the computing device 110 (e.g., processor 111) to perform steps of one or more of the methods disclosed herein. Alternatively, or in addition, the parity management module 150 may be embodied as one or more computer readable instructions stored on the non-transitory storage media 114.

The non-volatile memory system 102, in the depicted embodiment, includes a parity management module 150. The parity management module 150, in one embodiment, is configured to manage storage of parity data for the non-volatile memory device 120 described below. The parity management module 150, in certain embodiments, may determine a storage element of the non-volatile memory device 120 that has a higher error rate than other storage elements of the non-volatile memory device 120. The parity management module 150 may select the storage element for storing parity data for the other storage elements of the non-volatile memory device 120. Thus, the weakest storage element (e.g., the storage element most susceptible to read disturb) is used to store parity data. Because the weakest storage element is used to store parity data, the weakest storage element is not read very often thereby reducing the likelihood that the weakest storage element will be affected by read disturb. Accordingly, fewer system errors may result because the weakest storage element is not used for normal data storage which is read frequently. Moreover, a system that uses the parity management module 150 may have higher endurance, better reliability, and/or better performance in comparison with systems not using the parity management module 150.

In one embodiment, the parity management module 150 may comprise executable software code, such as a device driver, SML 130, or the like, stored on the computer readable storage media 114 for execution on the processor 111. In another embodiment the parity management module 150 may comprise logic hardware of one or more non-volatile memory devices 120, such as a non-volatile memory media controller 126, a non-volatile memory controller 124, a device controller, a field-programmable gate array (FPGA) or other programmable logic, firmware for an FPGA or other programmable logic, microcode for execution on a microcontroller, an application-specific integrated circuit (ASIC), or the like. In certain embodiments, the logic hardware of one or more of the non-volatile memory media controller 126 and the non-volatile memory controller 124 may perform functions of the parity management module 150, such as determining a storage element of a plurality of storage elements having an error rate higher than other elements of the plurality of storage elements, selecting a parity storage element from the plurality of storage elements, and/or storing parity data for the plurality of storage elements in the parity storage element. In a further embodiment, the parity management module 150 may include a combination of both executable software code and logic hardware.

In one embodiment, the parity management module 150 is configured to receive storage requests from the SML 130 via a bus 125 or the like. The parity management module 150 may be further configured to transfer data to/from the SML 130 and/or storage clients 116 via the bus 125. Accordingly, the parity management module 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the parity management module 150 may receive storage requests as an API call from a storage client 116, as an IO-CTL command, or the like. The parity management module 150 is described in greater detail below with regard to FIGS. 3 and 4.

According to various embodiments, a non-volatile memory controller 124 comprising the parity management module 150 may manage one or more non-volatile memory devices 120. The non-volatile memory device(s) 120 may comprise recording, memory, and/or storage devices, such as solid-state storage device(s), that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, erase blocks, sectors, blocks, collections or sets of physical storage locations (e.g., logical pages, logical erase blocks, described below), or the like.

The non-volatile memory controller 124 may comprise an SML 130, which may present a logical address space 134 to one or more storage clients 116. One example of an SML is the Virtual Storage Layer® of SanDisk Corporation of Milpitas, Calif. Alternatively, each non-volatile memory device 120 may comprise a non-volatile memory media controller 126, which may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

The SML 130 may maintain metadata 135, such as a forward index, to map logical addresses of the logical address space 134 to media storage locations on the non-volatile memory device(s) 120. The SML 130 may provide for arbitrary, any-to-any mappings from logical addresses to physical storage resources. As used herein, an "any-to any" mapping may map any logical address to any physical storage resource. Accordingly, there may be no pre-defined and/or pre-set mappings between logical addresses and particular, media storage locations and/or media addresses. As used herein, a media address refers to an address of a memory resource that uniquely identifies one memory resource from another to a controller that manages a plurality of memory resources. By way of example, a media address includes, but is not limited to: the address of a media storage location, a physical memory unit, a collection of physical memory units (e.g., a logical memory unit), a portion of a memory unit (e.g., a logical memory unit address and offset, range, and/or extent), or the like. Accordingly, the SML 130 may map logical addresses to physical data resources of any size and/or granularity, which may or may not correspond to the underlying data partitioning scheme of the non-volatile memory device(s) 120. For example, in some embodiments, the non-volatile memory controller 124 is configured to store data within logical memory units that are formed by logically combining a plurality of physical memory units, which may allow the non-volatile memory controller 124 to support many different virtual memory unit sizes and/or granularities.

As used herein, a logical memory element refers to a set of two or more non-volatile memory elements that are or are capable of being managed in parallel (e.g., via an I/O and/or control bus). A logical memory element may comprise a plurality of logical memory units, such as logical pages, logical memory divisions (e.g., logical erase blocks), and so on. As used herein, a logical memory unit refers to a logical construct combining two or more physical memory units, each physical memory unit on a respective non-volatile memory element in the respective logical memory element (e.g., each non-volatile memory element being accessible in parallel). As used herein, a logical memory division refers to a set of two or more physical memory divisions, each physical memory division on a respective non-volatile memory element in the respective logical memory element.

The logical address space 134 presented by the SML 130 may have a logical capacity, which may correspond to the number of available logical addresses in the logical address space 134 and the size and/or granularity of the data referenced by the logical addresses. For example, the logical capacity of a logical address space 134 comprising 2^32 unique logical addresses, each referencing 2048 bytes (2 KiB) of data may be 2^43 bytes. As used herein, a kibibyte (KiB) refers to 1024 bytes. In some embodiments, the logical address space 134 may be thinly provisioned. As used herein, a "thinly provisioned" logical address space 134 refers to a logical address space 134 having a logical capacity that exceeds the physical capacity of the underlying non-volatile memory device(s) 120. For example, the SML 130 may present a 64-bit logical address space 134 to the storage clients 116 (e.g., a logical address space 134 referenced by 64-bit logical addresses), which may exceed the physical capacity of the underlying non-volatile memory devices 120. The large logical address space 134 may allow storage clients 116 to allocate and/or reference contiguous ranges of logical addresses, while reducing the chance of naming conflicts. The SML 130 may leverage the any-to-any mappings between logical addresses and physical storage resources to manage the logical address space 134 independently of the underlying physical storage devices 120. For example, the SML 130 may add and/or remove physical storage resources seamlessly, as needed, and without changing the logical addresses used by the storage clients 116.

The non-volatile memory controller 124 may be configured to store data in a contextual format. As used herein, a contextual format refers to a self-describing data format in which persistent contextual metadata is stored with the data on the physical storage media 122. The persistent contextual metadata provides context for the data with which it is stored. In certain embodiments, the persistent contextual metadata uniquely identifies the data with which the persistent contextual metadata is stored. For example, the persistent contextual metadata may uniquely identify a sector or block of data owned by a storage client 116 from other sectors or blocks of data owned by the storage client 116. In a further embodiment, the persistent contextual metadata identifies an operation that is performed on the data. In a further embodiment, the persistent contextual metadata identifies a sequence of operations performed on the data. In a further embodiment, the persistent contextual metadata identifies security controls, a data type, or other attributes of the data. In a certain embodiment, the persistent contextual metadata identifies at least one of a plurality of aspects, including data type, a unique data identifier, an operation, and a sequence of operations performed on the data.

The persistent contextual metadata may include, but is not limited to: a logical address of the data, an identifier of the data (e.g., a file name, object id, label, unique identifier, or the like), reference(s) to other data (e.g., an indicator that the data is associated with other data), a relative position or offset of the data with respect to other data (e.g., file offset, or the like), data size and/or range, or the like. The contextual data format may comprise a packet format comprising a data segment and one or more headers. Alternatively, a contextual data format may associate data with context information in other ways (e.g., in a dedicated index on the non-volatile memory media 122, a memory division index, or the like).

In some embodiments, the contextual data format may allow data context to be determined and/or reconstructed based upon the contents of the non-volatile memory media 122, and independently of other metadata, such as the arbitrary, any-to-any mappings discussed above. Since the media location of data is independent of the logical address of the data, it may be inefficient or impossible to determine the context of data based solely upon the media location or media address of the data. Storing data in a contextual format on the non-volatile memory media 122 may allow data context to be determined without reference to other metadata. For example, the contextual data format may allow the metadata to be reconstructed based only upon the contents of the non-volatile memory media 122 (e.g., reconstruct the any-to-any mappings between logical addresses and media locations).

In some embodiments, the non-volatile memory controller 124 may be configured to store data on one or more asymmetric, write-once media 122, such as solid-state storage media. As used herein, a "write once" storage medium refers to a storage medium that is reinitialized (e.g., erased) each time new data is written or programmed thereon. As used herein, an "asymmetric" storage medium refers to a storage medium 122 having different latencies for different storage operations. Many types of solid-state storage media are asymmetric; for example, a read operation may be much faster than a write/program operation, and a write/program operation may be much faster than an erase operation (e.g., reading the media may be hundreds of times faster than erasing, and tens of times faster than programming the media).

The memory media 122 may be partitioned into memory divisions that can be erased as a group (e.g., erase blocks) in order to, inter alia, account for the asymmetric properties of the media 122 or the like. As such, modifying a single data segment in-place may require erasing the entire erase block comprising the data, and rewriting the modified data to the erase block, along with the original, unchanged data. This may result in inefficient "write amplification," which may excessively wear the media 122. Therefore, in some embodiments, the non-volatile memory controller 124 may be configured to write data out-of-place. As used herein, writing data "out-of-place" refers to writing data to different media storage location(s) rather than overwriting the data "in-place" (e.g., overwriting the original physical location of the data). Modifying data out-of-place may avoid write amplification, since existing, valid data on the erase block with the data to be modified need not be erased and recopied. Moreover, writing data out-of-place may remove erasure from the latency path of many storage operations (e.g., the erasure latency is no longer part of the critical path of a write operation).

The non-volatile memory controller 124 may comprise one or more processes that operate outside of the regular path for servicing of storage operations (e.g., the "path" for performing a storage operation and/or servicing a storage request). As used herein, the "path for servicing a storage request" or "path for servicing a storage operation" (also referred to as the "critical path") refers to a series of processing operations needed to service the storage operation or request, such as a read, write, modify, or the like. The path for servicing a storage request may comprise receiving the request from a storage client 116, identifying the logical addresses of the request, performing one or more storage operations on non-volatile memory media 122, and returning a result, such as acknowledgement or data. Processes that occur outside of the path for servicing storage requests may include, but are not limited to: a groomer, de-duplication, and so on. These processes may be implemented autonomously and in the background, so that they do not interfere with or impact the performance of other storage operations and/or requests. Accordingly, these processes may operate independent of servicing storage requests.

In some embodiments, the non-volatile memory controller 124 comprises a groomer, which is configured to reclaim memory divisions (e.g., logical or physical erase blocks) for reuse, using a garbage collection or other storage capacity recovery process. The write out-of-place paradigm implemented by the non-volatile memory controller 124 may result in obsolete or invalid data remaining on the non-volatile memory media 122. For example, overwriting data X with data Y may result in storing Y on a new memory division (e.g., rather than overwriting X in place), and updating the any-to-any mappings of the metadata to identify Y as the valid, up-to-date version of the data. The obsolete version of the data X may be marked as invalid, but may not be immediately removed (e.g., erased), since, as discussed above, erasing X may involve erasing an entire memory division, which is a time-consuming operation and may result in write amplification. Similarly, data that is no longer is use (e.g., deleted or trimmed data) may not be immediately removed. The non-volatile memory media 122 may accumulate a significant amount of invalid data.

A groomer process may operate outside of the critical path for servicing storage operations. The groomer process may reclaim memory divisions so that they can be reused for other storage operations. As used herein, reclaiming a memory division refers to erasing the memory division so that new data may be stored/programmed thereon. Reclaiming a memory division may comprise relocating valid data on the memory division to a new location. The groomer may identify memory divisions for reclamation based upon one or more factors, which may include, but are not limited to: the amount of invalid data in the memory division, the amount of valid data in the memory division, wear on the memory division (e.g., number of erase cycles), time since the memory division was programmed or refreshed, and so on.

The non-volatile memory controller 124 may be further configured to store data in a log format. As described above, a log format refers to a data format that defines an ordered sequence of storage operations performed on a non-volatile memory media 122. In some embodiments, the log format comprises storing data in a pre-determined sequence of media addresses of the non-volatile memory media 122 (e.g., within sequential pages and/or erase blocks of the media 122). The log format may further comprise associating data (e.g., each packet or data segment) with respective sequence indicators. The sequence indicators may be applied to data individually (e.g., applied to each data packet) and/or to data groupings (e.g., packets stored sequentially on a memory division, such as an erase block). In some embodiments, sequence indicators may be applied to memory divisions when the memory divisions are reclaimed (e.g., erased), as described above, and/or when the memory divisions are first used to store data.

In some embodiments the log format may comprise storing data in an "append only" paradigm. The non-volatile memory controller 124, using the log storage module 137 described below or the like, may maintain a current append point at a media address of the non-volatile memory device 120. The append point may be a current memory division and/or offset within a memory division. Data may then be sequentially appended from the append point. The sequential ordering of the data, therefore, may be determined based upon the sequence indicator of the memory division of the data in combination with the sequence of the data within the memory division. Upon reaching the end of a memory division, the non-volatile memory controller 124 may identify the "next" available memory division (e.g., the next memory division that is initialized and ready to store data). The groomer may reclaim memory divisions comprising invalid, stale, and/or deleted data, to ensure that data may continue to be appended to the media log.

The log format described herein may allow valid data to be distinguished from invalid data based upon the contents of the non-volatile memory media 122, and independently of other metadata. As discussed above, invalid data may not be removed from the non-volatile memory media 122 until the memory division comprising the data is reclaimed. Therefore, multiple "versions" of data having the same context may exist on the non-volatile memory media 122 (e.g., multiple versions of data having the same logical addresses). The sequence indicators associated with the data may be used to distinguish invalid versions of data from the current, up-to-date version of the data; the data that is the most recent in the log is the current version, and previous versions may be identified as invalid.

The storage management layer 130 may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, or the like.

The storage management layer 130 comprises and/or is communicatively coupled to one or more non-volatile memory devices 120. The one or more non-volatile memory devices 120 may include different types of non-volatile memory devices including, but not limited to: solid-state storage devices, hard drives, SAN storage resources, or the like. The one or more non-volatile memory devices 120 may comprise one or more respective non-volatile memory media controllers 126 and non-volatile memory media 122. As illustrated in FIG. 1, The SML 130 may provide access to the one or more non-volatile memory devices 120 via a traditional block I/O interface 131. Additionally, the SML 130 may provide access to enhanced functionality (e.g., a large, virtual address space 134) through the SML interface 132. The metadata 135 may be used to manage and/or track storage operations performed through any of the Block I/O interface 131, SML interface 132, cache interface 133, or other, related interfaces.

The cache interface 133 may expose cache-specific features accessible via the storage management layer 130. Also, in some embodiments, the SML interface 132 presented to the storage clients 116 provides access to data transformations implemented by the one or more non-volatile memory devices 120 and/or the one or more non-volatile memory media controllers 126.

The SML 130 may provide storage services through one or more interfaces, which may include, but are not limited to: a block I/O interface, an extended storage management layer interface, a cache interface, or the like. The SML 130 may present a logical address space 134 to the storage clients 116 through one or more interfaces. As discussed above, the logical address space 134 may comprise a plurality of logical addresses, each corresponding to respective media locations the on one or more non-volatile memory devices 120. The SML 130 may maintain metadata 135 comprising any-to-any mappings between logical addresses and media locations, as described above.

The SML 130 may further comprise a log storage module 137 that is configured to store data in a contextual, log format. The contextual, log data format may comprise associating data with persistent contextual metadata, such as the logical address of the data, or the like. The contextual, log format may further comprise associating data with respective sequence identifiers on the non-volatile memory media 122, which define an ordered sequence of storage operations performed on the one or more non-volatile memory devices 120, as described above.

The SML 130 may further comprise a non-volatile memory device interface 139 configured to transfer data, commands, and/or queries to the one or more non-volatile memory devices 120 over a bus 125, which may include, but is not limited to: a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 124 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 124 comprises one or more non-volatile memory devices 120. Although FIG. 1 depicts a single non-volatile memory device 120, the disclosure is not limited in this regard and could be adapted to incorporate any number of non-volatile memory devices 120.

The non-volatile memory device 120 may comprise non-volatile memory media 122, which may include but is not limited to: NAND flash memory, NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), resistive RAM (RRAM), programmable metallization cell (PMC), conductive-bridging RAM (CBRAM), magneto-resistive RAM (MRAM), dynamic RAM (DRAM), phase change RAM (PRAM or PCM), magnetic storage media (e.g., hard disk, tape), optical storage media, or the like. While the non-volatile memory media 122 is referred to herein as "memory media," in various embodiments, the non-volatile memory media 122 may more generally comprise a non-volatile recording media capable of recording data, which may be referred to as a non-volatile memory media, a non-volatile storage media, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, die planes, die, or the like. A non-volatile memory media controller 126 may be configured to manage storage operations on the non-volatile memory media 122, and may comprise one or more processors, programmable processors (e.g., field-programmable gate arrays), or the like. In some embodiments, the non-volatile memory media controller 126 is configured to store data on and/or read data from the non-volatile memory media 122 in the contextual, log format described above, and to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. As discussed above, the logical memory element may be partitioned into respective logical memory units (e.g., logical pages) and/or logical memory divisions (e.g., logical erase blocks). The logical memory units may be formed by logically combining physical memory units of each of the non-volatile memory elements. For example, if the non-volatile memory media 122 comprises twenty-five (25) non-volatile memory elements, each logical memory unit may comprise twenty-five (25) pages (e.g., a page of each element of non-volatile memory media 122).

The non-volatile memory controller 124 may comprise an SML 130 and the non-volatile memory media controller 126. The SML 130 may provide storage services to the storage clients 116 via one or more interfaces 131, 132, and/or 133. In some embodiments, the SML 130 provides a block-device I/O interface 131 through which storage clients 116 perform block-level I/O operations. Alternatively, or in addition, the SML 130 may provide a storage management layer (SML) interface 132, which may provide other storage services to the storage clients 116. In some embodiments, the SML interface 132 may comprise extensions to the block device interface 131 (e.g., storage clients 116 may access the SML interface 132 through extensions to the block device interface 131). Alternatively, or in addition, the SML interface 132 may be provided as a separate API, service, and/or library. The SML 130 may be further configured to provide a cache interface 133 for caching data using the non-volatile memory system 102.

As described above, the SML 130 may present a logical address space 134 to the storage clients 116 (e.g., through the interfaces 131, 132, and/or 133). The SML 130 may maintain metadata 135 comprising any-to-any mappings between logical addresses in the logical address space 134 and media locations on the non-volatile memory device 120. The metadata 135 may comprise a logical-to-physical mapping structure with entries that map logical addresses in the logical address space 134 and media locations on the non-volatile memory device 120. The logical-to-physical mapping structure of the metadata 135, in one embodiment, is sparsely populated, with entries for logical addresses for which the non-volatile memory device 120 stores data and with no entries for logical addresses for which the non-volatile memory device 120 does not currently store data. The metadata 135, in certain embodiments, tracks data at a block level, with the SML 130 managing data as blocks.

The non-volatile memory system 102 may further comprise a log storage module 137, which, as described above, may be configured to store data on the non-volatile memory device 120 in a contextual, log format. The contextual, log data format may comprise associating data with a logical address on the non-volatile memory media 122. The contextual, log format may further comprise associating data with respective sequence identifiers on the non-volatile memory media 122, which define an ordered sequence of storage operations performed on the non-volatile memory media 122, as described above. The non-volatile memory controller 124 may further comprise a non-volatile memory device interface 139 that is configured to transfer data, commands, and/or queries to the non-volatile memory media controller 126 over a bus 125, as described above.

Figure 2:
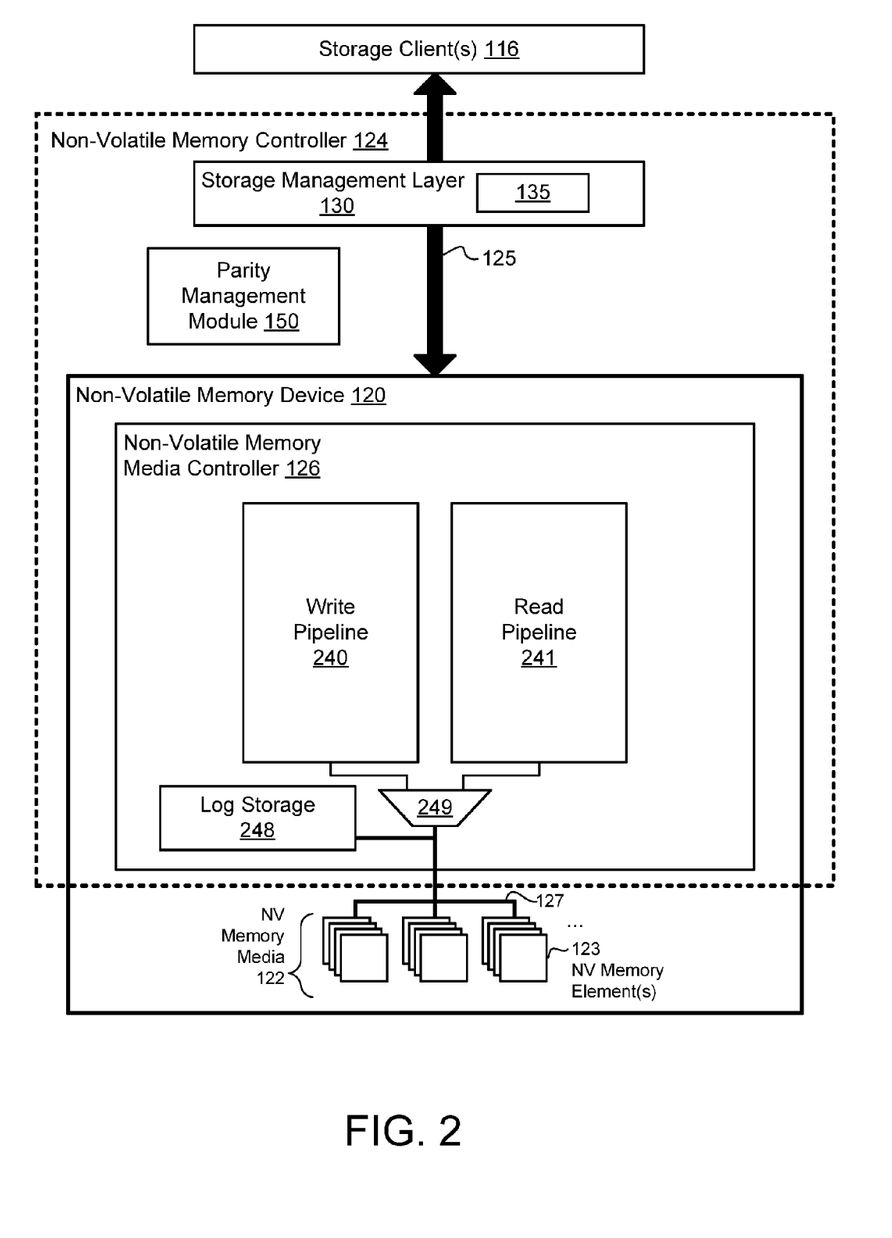
FIG. 2 is a schematic block diagram illustrating one embodiment of a system for parity storage management.

FIG. 2 depicts another embodiment of a non-volatile memory controller 124 configured to manage parity storage. The non-volatile memory device 120 may comprise a non-volatile memory media controller 126 and non-volatile memory media 122. The non-volatile memory media 122 may comprise a plurality of non-volatile memory elements 123, which may be communicatively coupled to the non-volatile memory media controller 126 via a bus 127, as described above.

The non-volatile memory media controller 126 may comprise a write pipeline 240 that is configured to store data on the non-volatile memory media 122 in a contextual format in response to requests received via the parity management module 150. The requests may include and/or reference data to be stored on the non-volatile memory media 122, may include logical address(es) of the data, and so on. As described above, the contextual format may comprise storing a logical address of the data in association with the data on the non-volatile memory media 122. For example, the write pipeline 240 may be configured to format data into packets, and may include the logical address of the data in a packet header or other packet field. The write pipeline 240 may be configured to buffer data for storage on the non-volatile memory media 122. In some embodiments, the write pipeline 240 may comprise one or more synchronization buffers to synchronize a clock domain of the non-volatile memory media controller 126 with a clock domain of the non-volatile memory media 122 and/or bus 127.

The log storage module 248 may be configured to select media location(s) for the data and may provide addressing and/or control information to the non-volatile memory elements 123 via the bus 127. In some embodiments, the log storage module 248 is configured to store data sequentially in a log format within the non-volatile memory media. The log storage module 248 may be further configured to groom the non-volatile memory media, as described above. In certain embodiments the log storage module 248 is substantially similar to the log storage module 137 as described above. The log storage module 248 may be executed by the SML 130 and/or by the non-volatile memory media controller 126.

Upon writing data to the non-volatile memory media, the non-volatile memory media controller 126 may be configured to update metadata 135 (e.g., a forward index) to associate the logical address(es) of the data with the media address(es) of the data on the non-volatile memory media 122. In some embodiments, the metadata 135 may be maintained on the non-volatile memory media controller 126; for example, the metadata 135 may be stored on the non-volatile memory media 122, on a volatile memory (not shown), or the like. Alternatively, or in addition, the metadata 135 may be maintained within the SML 130 (e.g., on a volatile memory 112 of the computing device 110 of FIG. 1). In some embodiments, the metadata 135 may be maintained in a volatile memory by the SML 130, and may be periodically stored on the non-volatile memory media 122.

The non-volatile memory media controller 126 may further comprise a read pipeline 241 that is configured to read contextual data from the non-volatile memory media 122 in response to requests received via the parity management module 150. The requests may comprise a logical address of the requested data, a media address of the requested data, and so on. The read pipeline 241 may be configured to read data stored in a contextual format from the non-volatile memory media 122 and to provide the data to the SML 130 and/or a storage client 116. The read pipeline 241 may be configured to determine the media address of the data using a logical address of the data and the metadata 135. Alternatively, or in addition, the SML 130 may determine the media address of the data and may include the media address in the request. The log storage module 248 may provide the media address to the non-volatile memory elements 123, and the data may stream into the read pipeline 241 via a buffer. The read pipeline 241 may comprise one or more read synchronization buffers for clock domain synchronization, as described above.

The non-volatile memory media controller 126 may further comprise a multiplexer 249 that is configured to selectively route data and/or commands to/from the write pipeline 240 and the read pipeline 241. In some embodiments, non-volatile memory media controller 126 may be configured to read data while filling a buffer of the write pipeline 240 and/or may interleave one or more storage operations on one or more banks of non-volatile memory elements 123 (not shown).

Figure 3:
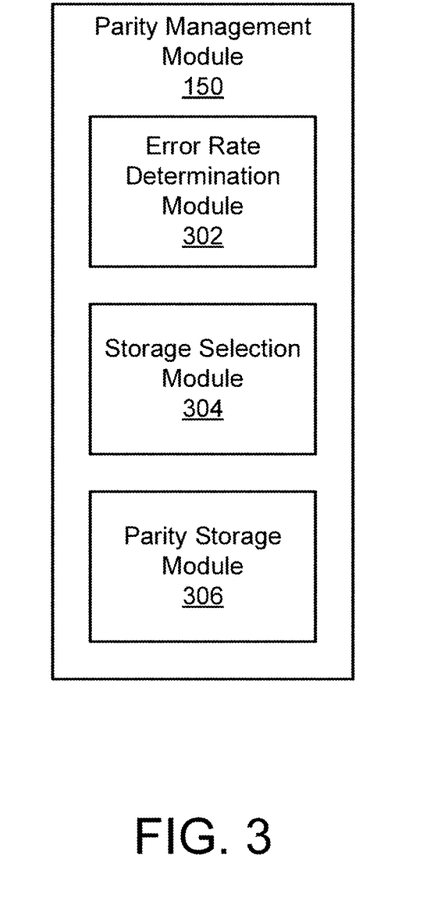
FIG. 3 is a schematic block diagram illustrating one embodiment of a parity management module.

FIG. 3 depicts one embodiment of a parity management module 150. The parity management module 150 may be substantially similar to the parity management module 150 described above with regard to FIG. 1. In general, as described above, the parity management module 150 determines a storage element to be used to store parity data for other storage elements, selects the storage element, and stores parity data in the storage element. In the depicted embodiment, the parity management module 150 includes an error rate determination module 302, a storage selection module 304, and a parity storage module 306.

In one embodiment, the error rate determination module 302 determines a storage element of a plurality of storage elements that has an error rate higher than other storage elements of the plurality of storage elements. For example, the error rate determination module 302 may determine a storage element of a plurality of storage elements that has an error rate higher than all other storage elements of the plurality of storage elements. The storage elements may be any suitable storage element or memory element. Moreover, the storage element may be one or more of a wordline, a block (e.g., an erase block), a chip, a die, a die plane, or the like. In some embodiments, the error rate determination module 302 may monitor or otherwise determine one or more error rates associated with the storage elements (e.g., a raw bit error rate (RBER), an uncorrectable bit error rate (UBER), or the like). The error rate determination module 302 may monitor the error rates of the storage elements in real time (e.g., in response to programming a storage element, in response to reading data from a storage element), at predetermined intervals (e.g., as part of a background scan of a storage element, in response to a storage capacity recover operation or garbage collection for a storage element), using a cumulative error count, or the like. In certain embodiments, the error rate determination module 302 may compare the error rates associated with the storage elements to one another and select the storage element with the highest error rate, as explained in greater detail in FIG. 4.

A storage element with an error rate higher than other storage elements may be the storage element that is considered weaker than other storage elements. Moreover, the storage element with the highest error rate may be the storage element most susceptible to read disturb. In various embodiments, the storage selection module 304 selects the storage element having the highest error rate as a parity storage element. Thus, the selected storage element may be used for storing parity data corresponding to the other storage elements of the plurality of storage elements (e.g., all storage elements of the plurality of storage elements except the storage element used for storing parity data). The storage selection module 304 may indicate to another device, such as the non-volatile memory controller 124 or the non-volatile memory media controller 126, which storage element is being used as the parity storage element.

Figure 5:
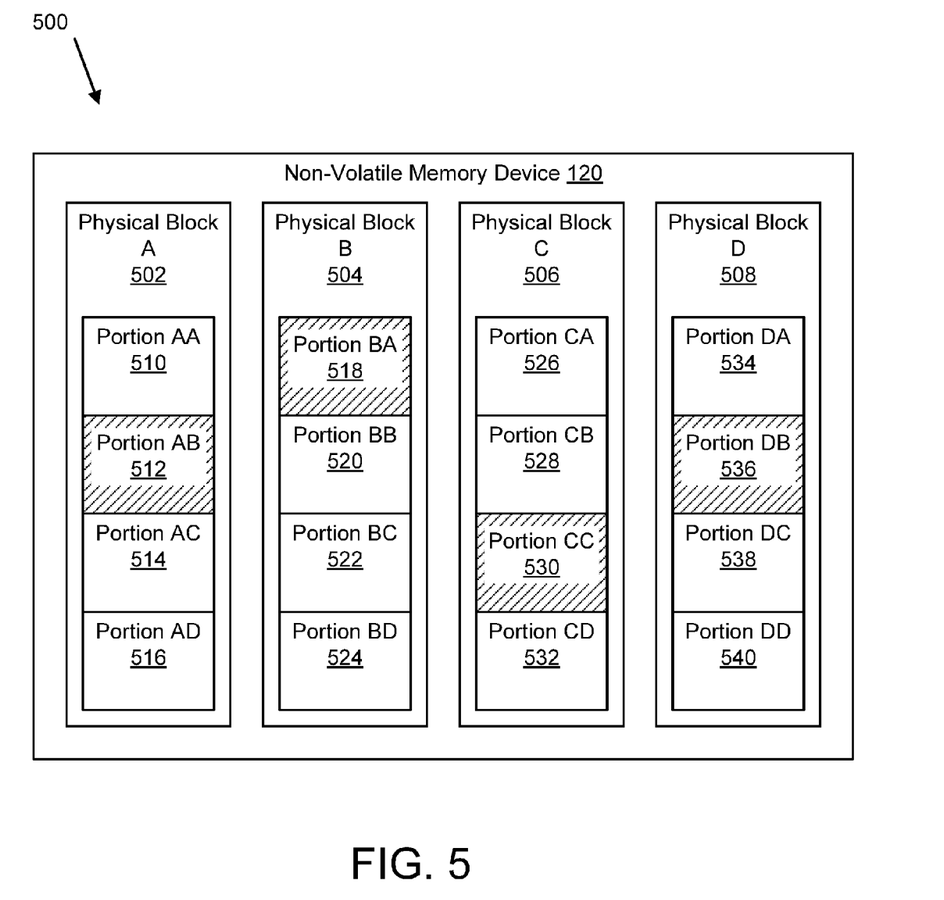
FIG. 5 is a schematic block diagram illustrating one embodiment of a logical block.

The parity storage element may be any logical or physical storage element. For example, the parity storage element may be a physical wordline, a physical block, a physical die or die plane, a logical set of physical wordlines, a logical set of physical blocks, a logical set of physical dies or die planes, a logical set of portions of multiple physical wordlines, a logical set of portions of multiple physical blocks, a logical set of portions of multiple physical dies or die planes, and so forth. One embodiment of a logical storage element that may be used as the parity storage element is illustrated in FIG. 5.

In certain embodiments, the parity storage module 306 stores parity data for the plurality of storage elements in the parity storage element. In some embodiments, the parity data includes an XOR data produced from data written to the plurality of storage elements. By using the XOR data and storage elements except the failed storage element (e.g., all but one failed storage element), data from the failed storage element may be reproduced. In various embodiments, the non-volatile memory controller 124 or the non-volatile memory media controller 126 may create the parity data and send the data to the parity storage module 306 for storage in the parity storage element. In certain embodiments, the parity storage module 306 may create the parity data and direct the parity data to the parity storage element for storage.

Figure 4:
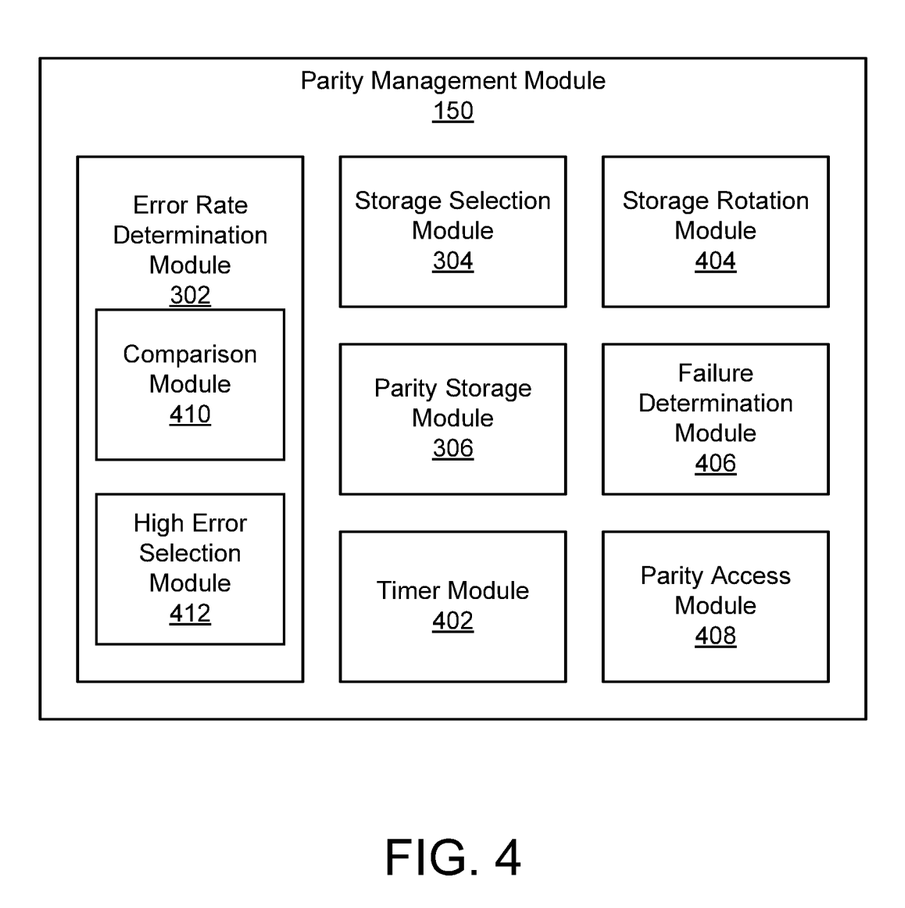
FIG. 4 is a schematic block diagram illustrating a further embodiment of a parity management module.

FIG. 4 depicts a further embodiment of a parity management module 150. The parity management module 150 may be substantially similar to the parity management module 150 described above with regard to FIGS. 1, 2, and/or 3. In the depicted embodiment, the parity management module 150 includes the error rate determination module 302, the storage selection module 304, and the parity storage module 306 and further includes a timer module 402, a storage rotation module 404, a failure determination module 406, and a parity access module 408. The error rate determination module 302, in the depicted embodiment, includes a comparison module 410 and a high error selection module 412.

In one embodiment, the timer module 402 determines a duration that a current parity storage element has been used. In certain embodiments, the timer module 402 may determine whether it is time (e.g., whether a predetermined time has elapsed) to check the plurality of storage elements to see if there is a new storage element with a higher error rate than the current parity storage element. In various embodiments, when it is determined to check the plurality of storage elements to see if there is a new storage element with a higher error rate than the current parity storage element, the timer module 402 may indicate such to the parity management module 150. Moreover, the error rate determination module 302 may determine the new storage element that has an error rate higher than the current parity storage element and/or all other parity storage elements. The storage selection module 304 may select the new storage element as a new parity storage element. Further, the parity storage module 306 may store parity data for the plurality of storage elements in the new parity storage element. In some embodiments, the timer module 402 may use a counter, an oscillator, or any suitable device to determine whether a predetermined time has elapsed.

In one embodiment, the timer module 402 may use a predetermined interval to direct the error rate determination module 302 to determine whether an operational error rate of a storage element is higher than an operational error rate of each of the other storage elements of the plurality of storage elements. In such an embodiment, the storage selection module 304 may select a new parity storage element to store parity data in response to determining the operational error rate of the storage element is lower than the operational error rate of one or more of the other storage elements. Further, in various embodiments, the storage selection module 304 may select a new parity storage element to store parity data in response to determining the operational error rate of the storage element is lower than the operational error rate the new parity storage element.

In various embodiments, the storage rotation module 404 may rotate storage of parity data among multiple storage elements. For example, parity data may be rotated among N storage elements out of a plurality of storage elements. As may be appreciated, N may be any suitable number, such as 2, 3, 4, or more. In such an example, the error rate determination module 302 may determine N storage elements of the plurality of storage elements having an error rate higher than M other storage elements (e.g., the remaining storage elements that does not include the N storage elements of the plurality of storage elements). The storage rotation module 404 may rotate storing parity data in the N storage elements for the plurality of storage elements (e.g., the M other storage elements, a combination of the M other storage elements and the N storage elements except the storage element being used to store parity data). The storage rotation module 404 may rotate storing parity data at any suitable interval. In some embodiments, the storage rotation module 404 may rotate storing parity data after each write operation, after each program operation, after each write or program operation, or the like.

In certain embodiments, the failure determination module 406 may determine whether a read failure of one of the storage elements occurs. For example, the failure determination module 406 may receive an indication when an attempt to read a storage element is unsuccessful. In some embodiments, the parity access module 408 may read parity data from the parity storage element in response to the failure determination module 406 determining that a read failure occurred. The parity data read from the parity storage element may be used to recover data that was not readable due to the read failure.

As set forth above, the error rate determination module 302 may include the comparison module 410 and the high error selection module 412. In one embodiment, the comparison module 410 compares data for each storage element of the plurality of storage elements. The comparison module 410 may compare any suitable data such as test data, age parameters, error rates, operational error rates, or the like. In certain embodiments, the comparison module 410 may rank the storage elements in an order from highest error rates to lowest error rates, or vice versa.

Test data may be any suitable test data. In some embodiments, the test data may include a manufacturer determined error rate, a vendor determined error rate, an error rate monitored during workload reads of user data, a periodically tested error rate, a periodically sampled error rate, an error rate determined during a storage capacity recovery event or garbage collection, an error rate determined after programming, and so forth. In certain embodiments, the test data, error rates, or the like may be stored with and/or on the plurality of storage elements. For example, test data determined by a manufacturer or vendor may be stored with the plurality of storage elements. In one embodiment, the error rate may be a bit error rate (e.g., UBER, RBER).

Any suitable test may be performed to determine one or more storage elements that have higher error rates or are weaker (e.g., using any suitable parameter) than the remaining storage elements. For example, in one embodiment, during manufacturing of a storage device, calibration may be performed on storage elements by doing program/erase cycles on portions of each storage element and collecting bit error rate information corresponding to each storage element. This bit error rate information may be useful to define weak storage elements. As another example, one or more manufacturing tests such as wafer sort, known-good die ("KGD") testing, and/or memory package testing may be used to classify storage elements into separate categories based on the specialized testing for determining weak storage elements, or the like. These manufacturing tests may include measuring a failed bit count after cycling, after additional read disturb stress, after additional data retention, and/or one or more combinations of the above, or the like.

In various embodiments, an age parameter may be used to track an age of each storage element. In some embodiments, a value for an age parameter may be assigned to a storage element based on an error rate of the storage element. For example, in one embodiment, at a predetermined time after programming (e.g., 1 minute, 2 minutes, or the like) a value for an age parameter may be assigned to each storage element based on an error rate for a respective storage element. As may be appreciated, storage elements may be ranked based on their age parameter to determine one or more storage elements that are the weakest.

In some embodiments, error rates may be any suitable type of error rate. In various embodiments, an error rate may be a read error rate, a write error rate, a programming error rate, an erase error rate, or the like. In certain embodiments, an operational error rate may be an error rate monitored during workload reads of user data, a periodically tested error rate, a periodically sampled error rate, an error rate determined during garbage collection, an error rate determined after programming, or any other error rate determined during operation or use of storage elements.

In various embodiments, the high error selection module 412 may select the storage element with the highest error rate, highest age parameter, highest operational error rate, or the like. Thus, the high error selection module 412 may determine which storage element is most likely susceptible to read disturb and/or is the weakest storage element so that the selected storage element may be used to store parity data.

FIG. 5 is a schematic block diagram illustrating one embodiment of a logical block 500 that may function as a storage element used as a parity storage element. One embodiment of a non-volatile memory device 120 is illustrated. In the illustrated embodiment, the non-volatile memory device 120 includes a physical block A 502, a physical block B 504, a physical block C 506, and a physical block D 508. Further, the physical block A 502 includes a portion AA 510, a portion AB 512, a portion AC 514, and a portion AD 516. Moreover, the physical block B 504 includes a portion BA 518, a portion BB 520, a portion BC 522, and a portion BD 524. In addition, the physical block C 506 includes a portion CA 526, a portion CB 528, a portion CC 530, and a portion CD 532. The physical block D 508 includes a portion DA 534, a portion DB 536, a portion DC 538, and a portion DD 540. As may be appreciated, any combination of the physical blocks 502-508 and the portions 510-540 may be part of a logical block that can be used as a parity storage element. In the illustrated embodiment, the logical block 500 includes the portions AB 512, BA 518, CC 530, and DB 536. Thus, the portions AB 512, BA 518, CC 530, and DB 536 may be used as the parity storage element. Accordingly, the parity storage element uses a portion of multiple physical storage blocks combined into one logical storage element.

Figure 6:
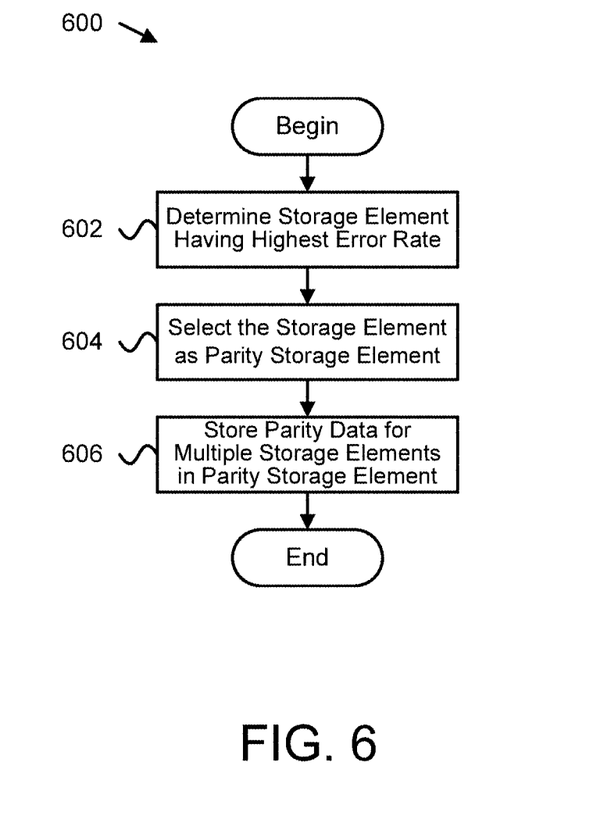
FIG. 6 is a schematic flow chart diagram illustrating one embodiment of a method for parity storage management.

FIG. 6 depicts one embodiment of a method 600 for parity storage management. The method 600 begins and the error rate determination module 302 determines 602 a storage element of a plurality of storage elements having an error rate higher than other storage elements of the plurality of storage elements. The storage selection module 304 selects 604 the storage element as a parity storage element. The parity storage module 306 stores 606 parity data for the plurality of storage elements in the parity storage element, and the method 600 ends.

Figure 7:
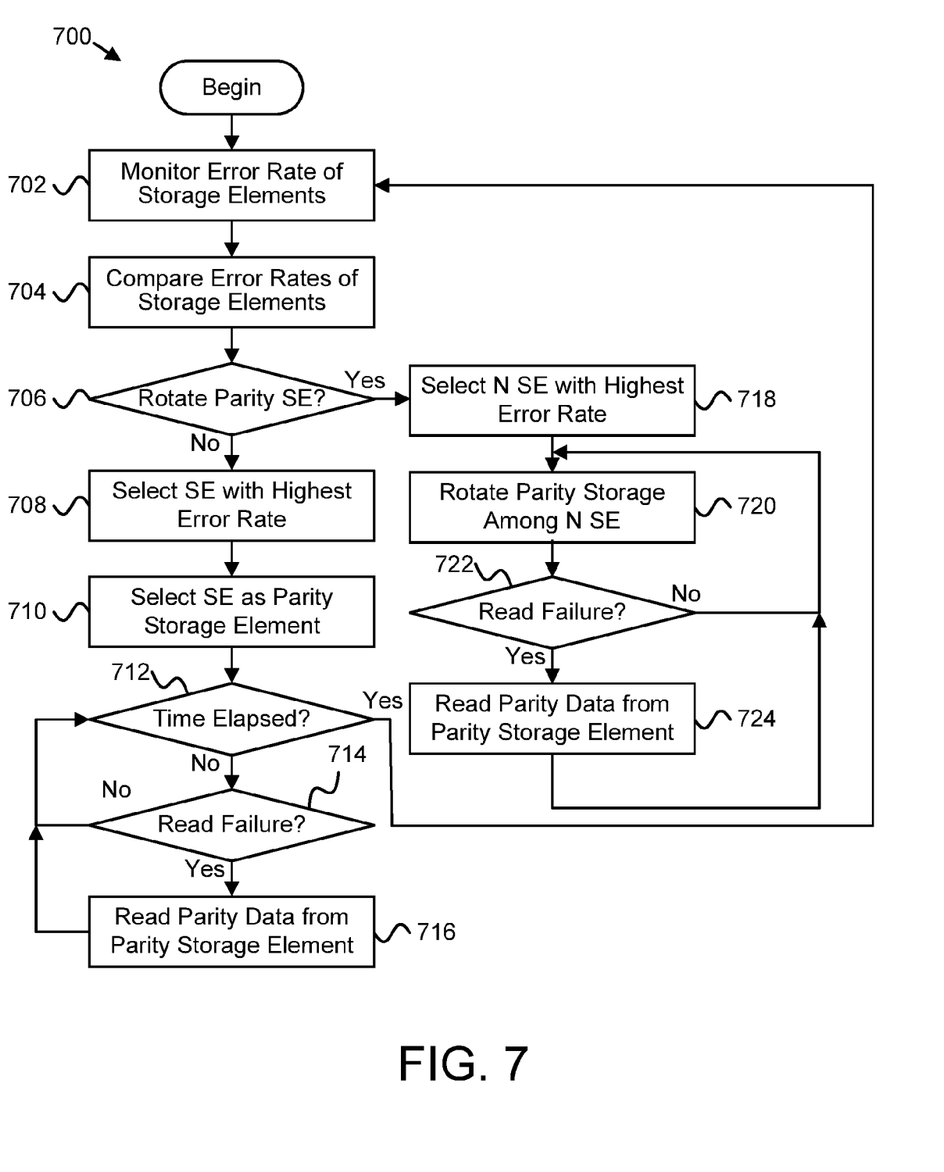
FIG. 7 is a schematic flow chart diagram illustrating a further embodiment of a method for parity storage management.

FIG. 7 is a schematic flow chart diagram illustrating a further embodiment of a method 700 for parity storage management. The method 700 begins, and the error rate determination module 302 monitors 702 error rates of storage elements of a plurality of storage elements. The comparison module 410 compares 704 the error rates of the storage elements to one another.

The storage rotation module 404 determines 706 whether to rotate a storage element ("SE") storing parity data among multiple storage elements. In response to determining 706 not to rotate storing parity data among multiple storage elements, the high error selection module 412 selects 708 the storage element that has the highest error rate. The storage selection module 304 selects 710 the storage element as the parity storage element.

The timer module 402 determines 712 whether a time has elapsed since the parity storage element was selected. In response to determining 712 that the time has not elapsed, the failure determination module 406 determines 714 whether a read failure has occurred. In response to determining 714 that a read failure has occurred, the parity access module 408 reads 716 parity data from the parity storage element, then the method 700 returns to determining 712 whether a time has elapsed since the parity storage element was selected. In response to determining 714 that a read failure has not occurred, the method 700 returns to determining 712 whether a time has elapsed since the parity storage element was selected. In response to determining 712 that the time has elapsed, the method 700 returns to monitoring 702 error rates of storage elements of a plurality of storage elements.

In response to determining 706 to rotate storing parity data among multiple storage elements, the error rate determination module 302 selects 718 N storage elements with the highest error rates. The storage rotation module 404 rotates 720 parity storage among the N storage elements. The failure determination module 406 determines 722 whether a read failure has occurred. In response to determining 722 that a read failure has occurred, the parity access module 408 reads 724 parity data from the parity storage element, then the method 700 returns to rotating 720 parity storage among the N storage elements. In response to determining 722 that a read failure has not occurred, the method 700 returns to rotating 720 parity storage among the N storage elements.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. A method comprising:
    determining, at a non-volatile storage device, that a storage element of a plurality of storage elements has an error rate higher than other storage elements of the plurality of storage elements;
    determining that the storage element has a highest likelihood of being affected by read disturb among the plurality of storage elements based on the determined error rate;
    selecting the storage element as a parity storage element to reduce the read disturb affecting the storage element by lowering a read frequency of the storage element; and
    storing parity data for the plurality of storage elements in the parity storage element.

2. The method of claim 1, wherein determining that the storage element of the plurality of storage elements has the error rate higher than the other elements of the plurality of storage elements comprises:
    comparing test data for each storage element of the plurality of storage elements, wherein the test data comprises the error rate; and
    selecting the storage element with a highest error rate.

3. The method of claim 2, wherein comparing the test data for each storage element of the plurality of storage elements comprises comparing manufacturing test data for each storage element of the plurality of storage elements, the manufacturing test data being stored with the plurality of storage elements.

4. The method of claim 1, wherein determining that the storage element of the plurality of storage elements has the error rate higher than the other elements of the plurality of storage elements comprises:
    comparing age parameters of each storage element of the plurality of storage elements; and
    selecting the storage element with a highest age parameter.

5. The method of claim 1, wherein determining that the storage element of the plurality of storage elements has the error rate higher than the other elements of the plurality of storage elements comprises:
    comparing an operational error rate of each storage element of the plurality of storage elements; and
    selecting the storage element with a highest operational error rate.

6. The method of claim 1, wherein the storage element comprises one or more of a wordline, a block, a chip, a die, and a die plane.

7. The method of claim 1, wherein the storage element comprises a logical block.

8. The method of claim 7, wherein the logical block comprises a portion of a plurality of physical blocks.

9. The method of claim 1, further comprising determining a read failure of one storage element of the plurality of storage elements.

10. The method of claim 9, further comprising reading the parity data from the parity storage element in response to the read failure of the one storage element to recover data that was not readable due to the read failure.

11. The method of claim 1, further comprising:
    determining that a second storage element of the plurality of storage elements has the error rate higher than the storage element;
    selecting the second storage element as a new parity storage element; and
    storing parity data for the plurality of storage elements in the new parity storage element.

12. The method of claim 11, wherein determining that the second storage element of the plurality of storage elements has the error rate higher than the storage element comprises determining that the second storage element has the determined error rate after selecting the storage element as the parity storage element.

13. The method of claim 1, further comprising:
    determining N storage elements of the plurality of storage elements having the error rate higher than M other storage elements of the plurality of storage elements, wherein the N storage elements comprises the storage element, and M and N are natural numbers; and
    rotating storing parity data for the plurality of storage elements between each storage element of the N storage elements for each write operation, program operation, or some combination thereof.

14. The method of claim 1, further comprising determining, at a predetermined interval, whether an operational error rate of the storage element is higher than an operational error rate of each of the other storage elements of the plurality of storage elements.

15. The method of claim 14, further comprising selecting a new parity storage element to store parity data in response to determining the operational error rate of the storage element is lower than the operational error rate of one or more of the other storage elements.

16. A system comprising:
    a plurality of storage elements; and
    a controller configured to:
        determine that a storage element of a plurality of storage elements has an error rate higher than other storage elements of the plurality of storage elements;
        determine that the storage element has a highest likelihood of being affected by read disturb among the plurality of storage elements based on the determined error rate; and
        select the storage element as a parity storage element to reduce the read disturb affecting the storage element by lowering a read frequency of the storage element and store parity data for the plurality of storage elements in the parity storage element.

17. The system of claim 16, wherein the controller comprises hardware of a nonvolatile storage device comprising the plurality of storage elements.

18. The system of claim 16, wherein the controller comprises a device driver for a non-volatile storage device comprising the plurality of storage elements, the device driver comprising a non-transitory computer readable storage medium storing executable code of the controller.

19. A computer program product comprising a non-transitory computer-readable storage medium storing computer usable program code, the computer usable program code executable to perform:

determining that a memory element of a plurality of memory elements has a higher error rate than other memory elements of the plurality of memory elements;

determining that the memory element has a highest likelihood of being affected by read disturb among the plurality of memory elements based on the determined error rate;

selecting the memory element as a backup memory element to reduce the read disturb affecting the memory element by lowering a read frequency of the memory element;

writing backup data to the backup memory element for the plurality of memory elements; and accessing the backup data in response to a read error on one of the plurality of memory elements.

20. An apparatus comprising:

means for determining, at a non-volatile storage device, that a storage element of a plurality of storage elements has an error rate higher than other storage elements of the plurality of storage elements;

means for determining that the storage element has a highest likelihood of being affected by read disturb among the plurality of storage elements based on the determined error rate;

means for selecting the storage element as a parity storage element to reduce the read disturb affecting the storage element by lowering a read frequency of the storage element; and means for storing parity data for the plurality of storage elements in the parity storage element.

\* \* \* \* \*